United States Patent [19]

Sugiura et al.

[11] 4,393,436

[45] Jul. 12, 1983

[54] CHASSIS ASSEMBLY

[75] Inventors: Shigekata Sugiura; Susumu Kanno, both of Soma, Japan

[73] Assignee: Alps Electric Co., Ltd., Tokyo, Japan

[21] Appl. No.: 174,225

[22] Filed: Jul. 31, 1980

[30] Foreign Application Priority Data

Aug. 4, 1979 [JP] Japan .............................. 54-107958[U]

[51] Int. Cl.³ .............................................. H05K 5/04
[52] U.S. Cl. .................................. 361/380; 174/35 R; 361/399; 361/424
[58] Field of Search ............. 174/35 R; 338/315, 317, 338/318, 329; 339/17 C; 361/272, 306, 331, 346, 380, 386, 388, 383, 384, 399, 392–396, 417, 419, 420, 424, 429; 228/4.5, 180 R, 180 A; 29/832, 837, 838, 839

[56] References Cited

U.S. PATENT DOCUMENTS

| 3,368,150 | 2/1968 | Worcester | 361/424 |
| 3,497,859 | 2/1970 | Bang | 361/405 |
| 3,883,721 | 5/1975 | Paulson | 338/317 |
| 4,159,506 | 6/1979 | Latasiewicz | 361/419 |

FOREIGN PATENT DOCUMENTS 53-113017 9/1978 Japan .

*Primary Examiner*—G. P. Tolin
*Attorney, Agent, or Firm*—Guy W. Shoup; Gerard F. Dunne

[57] ABSTRACT

A chassis assembly for electric components having a main chassis provided with a plurality of recesses formed by projecting predetermined parts of the bottom wall outwardly. Each recess is provided with an aperture for receiving the corresponding leg of a sub-chassis carrying electric parts. The legs are inserted into and projected through the apertures and are then welded to the outside of the projected parts of the bottom wall of the main chassis. The alignment of the legs with the apertures is easily achieved and the heating of the projected parts is made in a shorter time to ensure an improved efficiency of the work and good productivity.

6 Claims, 4 Drawing Figures

CHASSIS ASSEMBLY

BACKGROUND OF THE INVENTION

The present invention relates to a chassis for electric components and, more particularly, to an improvement in the chassis of a frequency converter for high-frequency wave signals.

Generally, the chassis for electric components for high-frequency wave signals, such as frequency converters or the like, have a plurality of sections shielded from one another and accomodating various stages such as high-frequency wave amplifier stage, mixer stage, oscillator stage and so forth. Each section must have an extremely small size because it handles high-frequency waves, so that it is extremely difficult to make the wiring connection in each section.

SUMMARY OF THE INVENTION

It is, therefore, an object of the invention to provide a chassis for electric components which is easy to assemble.

It is another object of the invention to provide a chassis assembly having a sub-chassis carrying electric circuits, the sub-chassis being easy to mount in a small-sized chassis for electric equipment.

According to the invention, various electric components are first mounted to a sub-chassis having a plurality of legs adapted to fit within respective apertures in the main chassis. In this way, the legs may be inserted into the apertures and soldered therein to fix the components in a simple manner.

These and other objects, as well as advantageous features of the invention will become clear from the following descriptions of the preferred embodiments taken in conjunction with the accompanying drawings.

BRIEF DESCRIPTION OF THE PREFERRED EMBODIMENTS

DESCRIPTION OF THE PREFERRED EMBODIMENT

Figure 1:
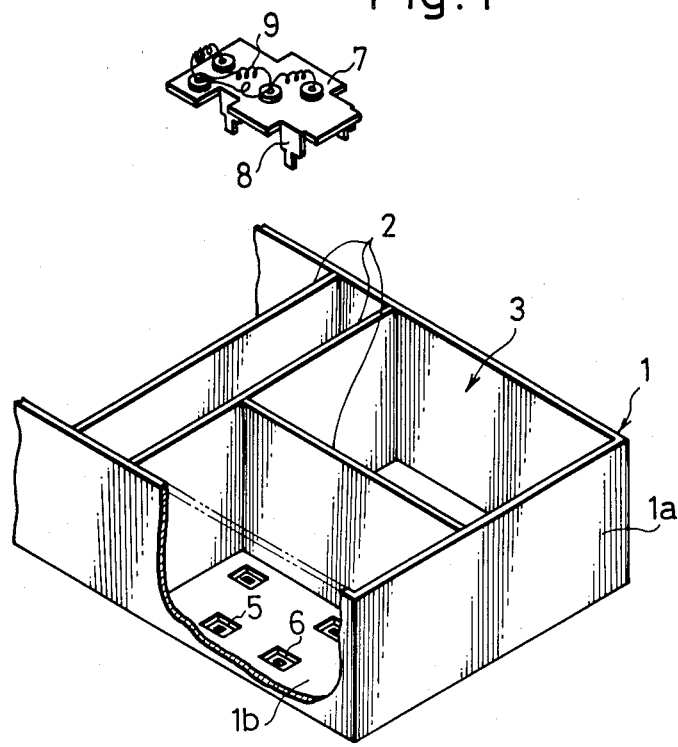
FIG. 1 is a perspective view of a chassis assembly constructed in accordance with an embodiment of the invention, with a part thereof being removed.
Figure 2:
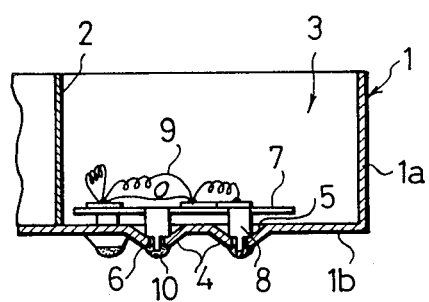
FIG. 2 is a sectional view of the chassis assembly of the invention.

A preferred embodiment of the invention will be described hereinunder with reference to the accompanying drawings.

Referring to the drawings, a reference numeral 1 denotes a box-shaped metallic main chassis. The space inside the main chassis 1 is sectioned into a plurality of sections 3 by shield plates 2. Each section 3 is defined by shield plates 2, side surfaces 1a of the chassis 1 and the bottom wall 1b of the same. In each section 3, the bottom wall 1b of the chassis 1 is projected outwardly to form projected portions 4 which in turn provide respective recesses 5 at the inside of the section 3. An aperture 6 of a size smaller than that of each recess 5 is formed at the end of the latter.

A sub-chassis 7 is also made of a metal and is provided with a plurality of bent legs 8 which, preferably, are tapered to have narrow ends. The sub-chassis 7 carries electric parts 9 such as capacitors, and is mounted in the main chassis 1 with its bent legs 8 inserted into the apertures 6 of the recesses 5 in the appropriate section 3 and welded to the bottom wall 1b of the main chassis 1.

Hereinafter, an explanation will be made as to the assembling of the electric equipment having the chassis assembly of the invention.

First of all, the electric parts 9 are mounted on the sub-chassis 7 while it is outside of the main chassis 1. Then, the sub-chassis 7 is placed in the section 3 with its legs 8 directed downwardly, and the legs 8 are fitted to the recesses 5 formed in the bottom wall 1b of the main chassis 1. The legs 8 are then inserted into respective apertures 6 formed in the end of the recess 5.

The use of the sub-chassis 7 eliminates the troublesome work for electric connection in the small section 3 so that the efficiency of the assembling work is considerably improved as compared with conventional techniques. In addition, the alignment of the legs 8 with the apertures 6 is facilitated by the provision of the openings of the recesses 5 being greater than those of the apertures 6. Namely, the alignment is easily achieved at first by bringing, at the first step, the legs 8 into alignment with the recesses 5 and then moving the legs 8 as the second step within the limited area of the recesses 5 until the legs 8 are brought into alignment with the apertures 6.

Figure 3A:
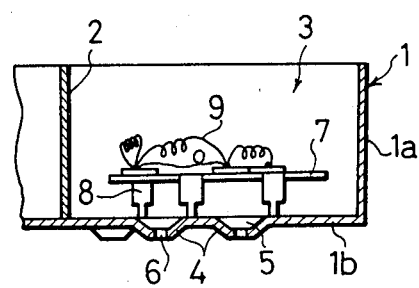
FIG. 3A is a sectional view for explaining the process for mounting a sub-chassis in the chassis assembly of the invention.
Figure 3B:
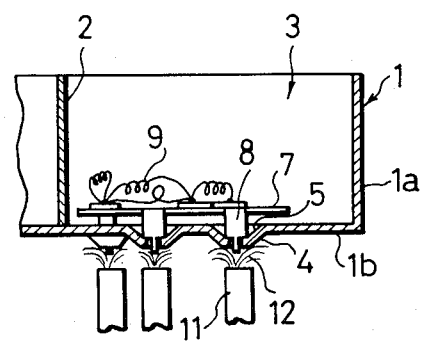
FIG. 3B is a sectional view for explaining a process for fixing a sub-chassis in a chassis in accordance with the invention.

Then, after mounting the sub-chassis 7 in the main chassis 1 in a way described above, the projections 4 of the main chassis 1 are made to contact with a molten solder 12 which flows out of a nozzle 11 as shown in FIG. 3B, so that the legs 8 of the sub-chassis 7 are soldered to the bottom wall 1b of the main chassis 1, to complete the assembling.

It will be understood by those skilled in the art that the soldering work is completed in a shorter time because only local portions, i.e. the projected portions 4, are made to contact with the molten solder so as to be heated promptly up to the soldering temperature.

The alignment of the legs 8 of the sub-chassis 7 with the apertures 6 is further facilitated by imparting such a taper to the projected part 4 of the bottom wall 1b of the main chassis 1 as to have a cross-sectional area decreasing toward the end thereof, as shown in the drawings.

The present invention is not, of course, limited to the above-described embodiment; it may be modified in various ways within the scope of the appended claims.

What is claimed is:

1. A chassis assembly for electric components, comprising:
    a main chassis made of a metallic material and having a plurality of recesses projecting outwardly from the bottom wall thereof, each of said recesses being provided with an aperture formed centrally therein; and
    a sub-chassis carrying at least one electric part and having means including metallic legs adapted to be inserted into respective ones of said apertures with said legs being projected exteriorly through said apertures of said recesses so that said legs can be soldered to the outside of said main chassis for securing said sub-chassis within said main chassis.

2. A chassis assembly for electric components as claimed in claim 1, wherein said recesses each have an inside diameter greater than that of the respective aperture.

3. A chassis assembly for electric components as claimed in claim 1, wherein said legs of said sub-chassis have narrowed ends.

4. A method for assemblying a chassis for electric components, comprising the steps of:
forming a main chassis of metallic material so as to have a plurality of recesses projecting outwardly from the bottom wall thereof, each of said recesses being provided with an aperture formed centrally therein;

securing a sub-chassis carrying at least one electric part and having metallic legs to said main chassis by projecting said legs exteriorly through said apertures of said recesses and then soldering said legs to the outside of said main chassis.

5. A method according to claim 4, including the step of forming each of said recesses with an inside diameter greater than that of the respective aperture.

6. A method according to claim 4, including the step of forming said legs of said sub-chassis with narrowed ends.

* * * * *